(12) United States Patent
Krivokapic

(10) Patent No.: US 6,599,824 B1
(45) Date of Patent: Jul. 29, 2003

(54) SYSTEM FOR AND METHOD OF FORMING LOCAL INTERCONNECT USING MICROCONTACT PRINTING

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 62 days.

(21) Appl. No.: 09/793,054

(22) Filed: Feb. 26, 2001

(51) Int. Cl.⁷ .......................... H01L 21/4763
(52) U.S. Cl. .................. 438/618; 438/637; 438/629; 438/678
(58) Field of Search ............... 438/261, 640, 438/618, 637, 629, 678

(56) References Cited

U.S. PATENT DOCUMENTS 5,512,131 A * 4/1996 Kumar et al.
6,060,121 A * 5/2000 Hidber et al.
6,180,494 B1 * 1/2001 Manning .................. 438/443

* cited by examiner

*Primary Examiner*—George Fourson
*Assistant Examiner*—Khiem Nguyen
(74) *Attorney, Agent, or Firm*—Foley & Lardner

(57) ABSTRACT

The disclosure relates to a system for and a method of forming a local interconnect in an integrated circuit using microcontact printing. An exemplary method of the disclosure can include applying an active agent to a stamp, stamping the stamp on a portion of an integrated circuit wafer to form an aperture in a layer of material on the integrated circuit wafer, and providing a conductive material in the aperture formed by the stamp. The stamp preferably has a wedge-shaped extrusion with a length corresponding to a length of an interconnect to be formed in the portion of the integrated circuit wafer. The conductive material in the aperture defines the interconnect. In one example, the interconnect can be as narrow as 20 to 50 nanometers (nm).

20 Claims, 3 Drawing Sheets

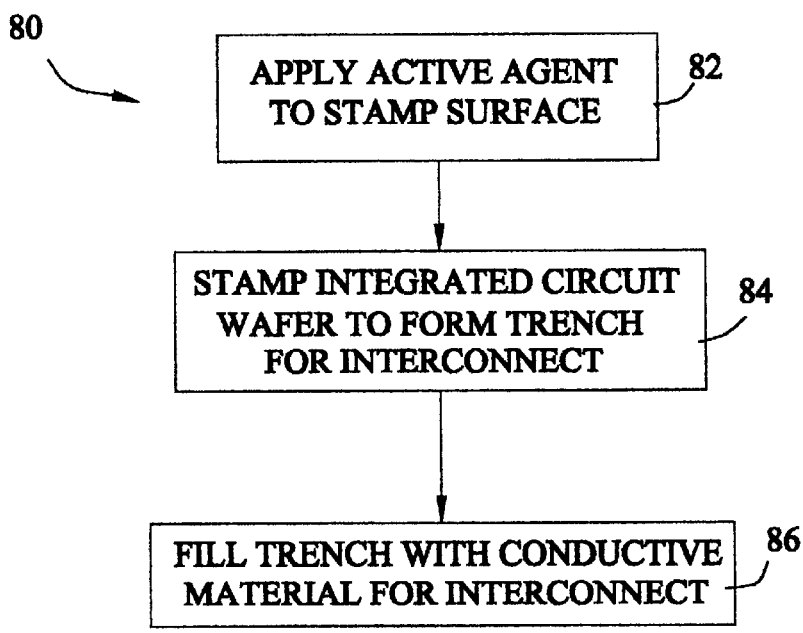
FIG. 4
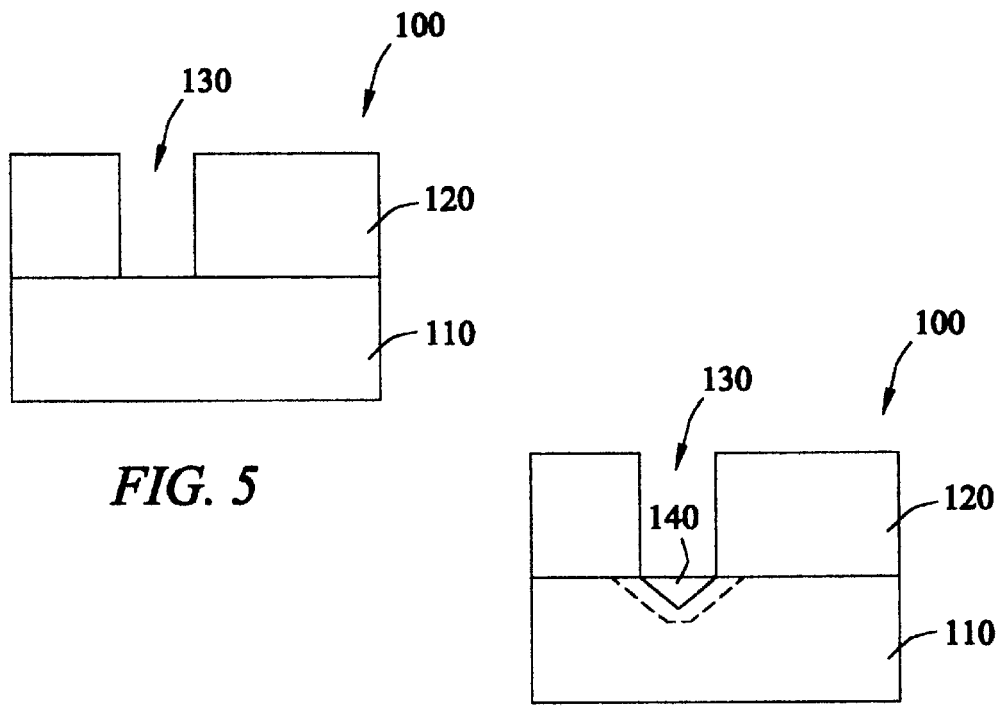
FIG. 5
FIG. 6

SYSTEM FOR AND METHOD OF FORMING LOCAL INTERCONNECT USING MICROCONTACT PRINTING

FIELD OF THE INVENTION

The present specification relates generally to the field of integrated circuits and to methods of manufacturing integrated circuits (ICs). More particularly, the present specification relates to a system for and a method of forming local interconnects using microcontact printing.

BACKGROUND OF THE INVENTION

The semiconductor industry desires to manufacture integrated circuits (ICs) with higher and higher densities of devices on a smaller chip area to achieve greater functionality and to reduce manufacturing costs. This desire for large-scale integration has led to a continued shrinking of the circuit dimensions and features of the devices.

The ability to reduce the size of structures such as shorter gate lengths in field-effect transistors is driven by lithographic technology which is, in turn, dependent upon the wavelength of light used to expose the photoresist. In current commercial fabrication processes, optical devices expose the photoresist using light having a wavelength of 248 nm (nanometers). Research and development laboratories are experimenting with the 193 nm wavelength to reduce the size of structures. Further, advanced lithographic technologies are being developed that utilize radiation having a wavelength of 157 nm and even shorter wavelengths, such as those used in Extreme Ultra-Violet (EUV) lithography (e.g., 13 nm).

One challenge facing lithographic technology is fabricating features below 100 nm. Although photolithography is the most widely used technology in IC fabrication, other fabrication technologies are being explored. One such technology is "soft lithography", which is a non-photolithographic strategy based on such techniques as self-assembly, replica molding, and stamping. Examples are provided in U.S. Pat. Nos. 5,512,131 (Kumar et al.), 5,900,160 (Whitesides et al.), and 6,060,121 (Hidber et al.), and also in Xia, Y. and Whitesides, G., "Soft Lithography", Annu. Rev. Mater. Sci. 1998, 28:153–84.

As explained by Xia and Whitesides, soft lithography utilizes an elastomeric block or stamp with patterned relief structures on its surface. The elastomeric block is cast molded, coated with a self-assembled monolayer (SAM), then printed onto a suitable medium, such as Au or Ag—a thin monolayer of material having a desired chemical property results. Soft lithography has been proposed for such applications as microcontact printing of SAMs, patterned SAMs as resists in selective wet etching, patterned SAMs as templates in selective deposition, micromolding, and related techniques.

One area of lithography which requires further development is the area of local interconnects. Certain integrated circuits (ICs) and IC fabrication processes utilize local interconnects to electrically couple transistor elements. Local interconnects can connect a drain, source, or gate of one transistor to a drain, source, or gate of another transistor. Additionally, local interconnects can connect the drain, source, or gate of one transistor to the drain, source, or gate of the same transistor or to other circuits or conductors within the IC. Generally, conventional local interconnects are formed below a first aluminum (Al) or metal layer associated with an IC (e.g., at the same level or below the top surface of a first thick insulating layer over the semiconductor substrate).

Local interconnects can be created in a trench etch and fill process before the first metal layer is provided over the first thick insulating layer. Local interconnects are generally formed after transistors are formed on the semiconductor substrate and covered by the first thick insulating layer. The thick insulating layer is etched to form trenches which connect the various circuit and transistor elements in accordance with the particular design of the IC. The trenches are filled with a conductive material, such as, polysilicon, tungsten, or other metal to complete the local interconnect. In this way, connections between transistors, nodes, and other elements can be achieved locally without using the first metal layer. As device sizes continue to decrease, the reduction in local interconnect size has remained an obstacle.

Thus, there is a need for microcontact printing for interconnects. Further, there is a need for narrower interconnects. Yet further, there is a need for a system for and method of forming local interconnects using microcontact printing.

The teachings hereinbelow extend to those embodiments which fall within the scope of the appended claims, regardless of whether they accomplish one or more of the above-mentioned needs.

SUMMARY OF THE INVENTION

An exemplary embodiment is related to a method of forming a local interconnect in an integrated circuit using microcontact printing. This method can include applying an active agent to a stamp, stamping the stamp on a portion of an integrated circuit wafer to form an aperture in a layer of material on the integrated circuit wafer, and providing a conductive material in the aperture formed by the stamp. The stamp preferably has a wedge-shaped extrusion with a length corresponding to a length of an interconnect to be formed in the portion of the integrated circuit wafer. The conductive material in the aperture defines the interconnect. In one example, the interconnect can be as narrow as 20 to 50 nanometers (nm).

Another exemplary embodiment is related to a method of fabricating an integrated circuit. This method can include providing a dielectric layer over an integrated circuit wafer, selectively forming a trench in the dielectric layer using an extrusion from a stamp, and filling the trench with a conductive material to form an interconnect.

Another embodiment is related to a system for forming local interconnect using microcontact printing. This system can include a stamp having a wedge-shaped extrusion with a length corresponding to the length of an interconnect to be formed in a portion of an integrated circuit.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and:

FIG. 4 is a flow diagram of a method of forming local interconnect in an integrated circuit using microcontact printing in accordance with an exemplary embodiment;

FIG. 5 is a schematic representation of an exemplary step in the formation of a stamp;

FIG. 6 is a schematic representation of an exemplary etching step in the formation of a stamp.

DETAILED DESCRIPTION OF EXEMPLARY EMBODIMENTS

The description made below with reference to FIGS. 1–7 provides details regarding exemplary embodiments. These exemplary embodiments are intended only to illustrate examples of various configurations, process steps, dimensions, materials, and uses of the invention defined by the claims. Therefore, details describing the exemplary embodiments should not be construed in a limiting manner.

Figure 1:
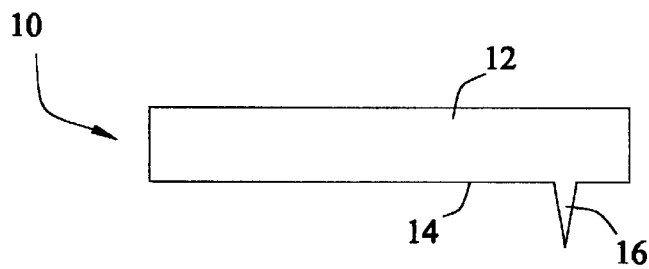
FIG. 1 is a schematic representation of a stamp in accordance with an exemplary embodiment.

Referring first to FIG. 1, a stamp 10 is illustrated. In an exemplary embodiment, stamp 10 comprises an elastomer, such as, poly(dimethylsiloxane) (PDMS), a silicon rubber, a polyurethane, a polyimide, or other elastomers. Stamp 10 can include a base portion 12 and a stamping surface 14. In an exemplary embodiment, stamp 10 has the size of a whole die. Stamping surface 14 is configured in this exemplary embodiment with a wedge-shaped extrusion 16. Wedge-shaped extrusion 16 can have a sharp edge, which allows for a cutting function. In an exemplary embodiment, wedge-shaped extrusion 16 can have a length corresponding to the length of an interconnect to be formed in an integrated circuit. The length can be the thickness of the highest point of the integrated circuit to the bottom surface of the dielectric layer. In an exemplary embodiment, the length of wedge-shaped extrusion 16 is 250–750 nm. Accordingly, stamp 10 is suitable for printing an interconnect without a planar process. The elasticity of stamp 10 enables patterning on non-planar surfaces. In alternative embodiments, extrusion 16 can have any of a variety of different configurations which allow a trench or aperture to be formed. For example, instead of a wedge-shape, a trapezoidally-shaped extrusion could be used.

Stamp 10 can be formed by making a groove in silicon (Si) using KOH. In an exemplary embodiment, stamp 10 has the same size as a die. Wedge-shaped extrusion 16 has a length of the interconnect width, which can be 10–30 nm. In an alternative embodiment, stamp 10 can include more than one wedge-shaped extrusion. Advantageously, stamp 10 provides for the formation of trenches with widths of 100 nm, which corresponds to the interconnect pitch (i.e., minimum line width +spacing to the next line) of less than 200 nm.

Stamp 10 can have fiducials like reticles. Once stamp 10 is hardened in the stamp formation process, it can be dipped into a catalytic colloid in a controlled way. For example, only the tips of the wedges are dipped into the colloid. Stamp 10 is very elastic and can be easily shaped conformally with the topography. Advantageously, stamping is very inexpensive. From one wafer, it is possible to get hundreds of stamps and each one can be used for tens of thousands of stamping processes. An exemplary process of stamp formation is described with reference to FIGS. 5–7 below.

Figure 2:
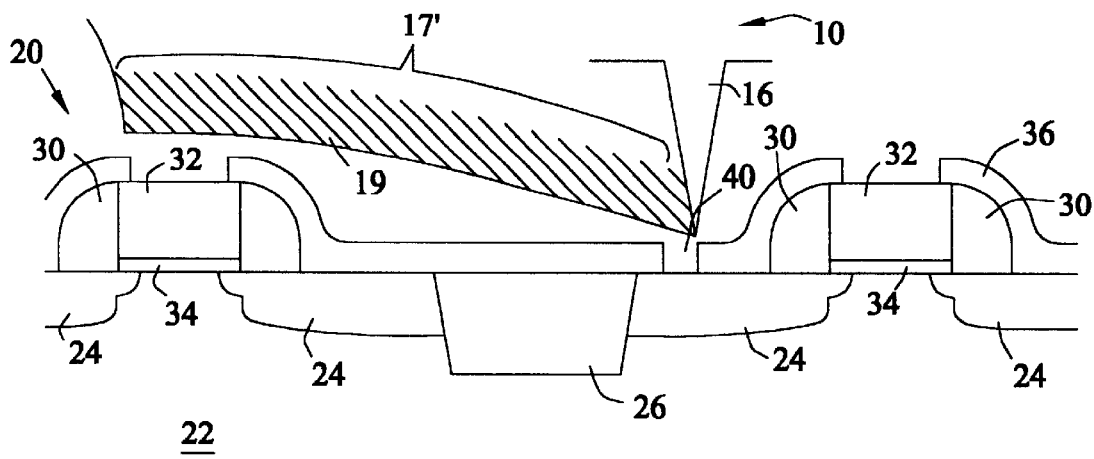
FIG. 2 is a schematic cross-sectional view of a portion of an integrated circuit and a stamp in accordance with another exemplary embodiment.

FIG. 2 illustrates a portion 20 of an integrated circuit, including a substrate 22, active regions 24, trench 26, spacers 30, gates 32, gate oxide layers 34, and dielectric layer 36. Substrate 22 can be an entire IC wafer or part of an IC wafer. Substrate 22 can be part of an integrated circuit, such as, a memory, a processing unit, an input/output device, etc. Active regions 24 can include a source, drain, source extension, drain extension, or any other structure doped for electrical activity within portion 20.

Trench 26 can be filled with any of a variety of insulative materials. Trench 26 can be a shallow trench isolation (STI) structure and is located to electrically isolate sections in portion 20 from each other. Spacers 30 can be any dielectric material, such as, silicon nitride, silicon oxynitride, and silicon rich nitride, and are located abutting lateral sides of gates 32. Gates 32 can be aluminum or any other electrically conductive or semiconductive material. Gates 32 are separated from substrate 22 by oxide layers 34. Oxide layers 34 can be any of a variety of dielectric materials.

Dielectric layer 36 is a layer of dielectric material disposed over active regions 24, trench 26, spacers 30, and gate 32. In an exemplary embodiment, an aperture 40 is created in dielectric layer 36 using stamp 10. Aperture 40 can have a width of 120 nm and a depth of 100 nm. In alternative embodiments, aperture 40 has a width of 80–160 nm and a depth of 100–250 nm.

Referring still to FIG. 2, stamp 10 is shown from a perspective view. As shown from this view, stamp 10 includes extrusion 16 having a length 17. In an exemplary embodiment, length 17 can be between 250 and 750 nm long. As described above with reference to FIG. 1, the length of extrusion 16 corresponds to the length of aperture 40 or the length of the interconnect. In an exemplary embodiment, the stamping surface is covered by an active agent 19, such as, palladium (for Cu) and cobalt (for Ni) which serves as a catalytic colloid. A copper (Cu) electroless deposition palladium can be used.

During formation of the local interconnect in aperture 40, stamp 10 transfers the layer of active agent onto the wafer. The transferred layer of active agent serves as a seeding layer for electroless copper (Cu) deposition. Electroless copper deposition is one way to fill aperture 40 with a conductive material and form an interconnect. Electroless copper deposition can include plating copper, nickel or silver by a redox reaction of complexed metal in formaldehyde without any electrical current. As such, the deposition can be done on dielectric layers, too. In other embodiments, different processes can be utilized to fill aperture 40 with a variety of different materials.

Figure 3:
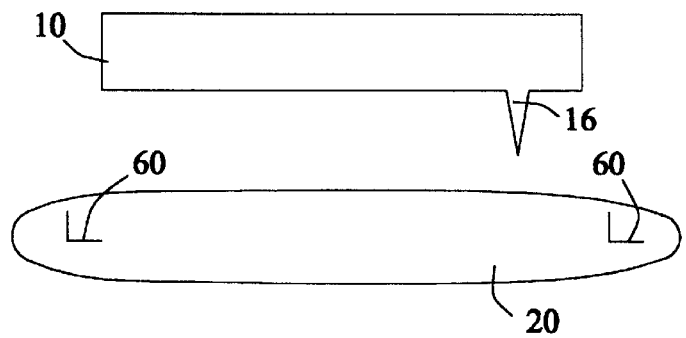
FIG. 3 is a schematic representation of a stamp and an integrated circuit wafer configured for use with the stamp in accordance with yet another exemplary embodiment.

FIG. 3 illustrates alignment of stamp 10 to portion 20. Alignment structures 60 can be used to align portion 20 during lithography processes and during stamping. Since poly(dimethylsiloxane) (PDMS) is transparent for wavelengths of light or radiation less than 300 nanometers (nm), it is possible to use the same alignment structures to achieve a good alignment with stamp 10 as used in conventional lithography. Such alignment structures can include any of a variety of fiducials, such as, alignment marks. In an exemplary embodiment, alignment involves shining a laser light through fiducials on the stamp on the wafer. Alignment marks can be well-controlled trenches with a depth that maximizes reflected intensity. Reflected laser light is collected by a photo detector.

Advantageously, stamping utilizing stamp 10 described with reference to FIGS. 1–3 simplifies the process of interconnect formation and allows very narrow (e.g., 20–50 nanometers (nm)) local interconnects. Thus, stamping simultaneously forms aperture 40 for the local interconnect and seeds the aperture for the conductive material of the local interconnect.

FIG. 4 is a flowchart 80 illustrating steps in an exemplary method of forming local interconnect in an integrated circuit using microcontact printing. In a step 82, an active agent is applied to the surface of stamp 10 described with reference to FIGS. 1–3. After step 82, a step 84 is performed in which stamp 10 is stamped or depressed against portion 20 of the integrated circuit. Stamping of stamp 10 against portion 20 creates a trench or aperture in a layer of portion 20 from wedge-shaped extrusion 16. In an exemplary embodiment, the trench or aperture is created in dielectric layer 36 (described with reference to FIG. 2).

After step 84, a step 86 is performed in which the trench or aperture is filled with a conductive material. Once the trench or aperture is filled, it is an interconnect. Advantageously, wedge-shaped extrusion 16 has a small width, resulting in a narrow interconnect. In an exemplary embodiment, the trench (and thus the interconnect) can be as narrow as 20 to 50 nanometers (nm).

FIG. 5 illustrates an exemplary stamp formation technique involving a fabrication portion 100. Portion 100 includes a silicon wafer 110 and a patterned hard mask 120. Patterned hard mask 120 can be a nitride layer having an aperture or opening 130. Referring now to FIG. 6, an etching process is performed to form wedge structures on the stamp. In an exemplary embodiment, a KOH etch makes a groove 140 in silicon wafer 110 due to preferential etch. By controlling the etch time, it is possible to determine the length of the wedge which defines the width of the local interconnect. To achieve a groove height of approximately 100 nm, for example, it is necessary to have trenches in nitride hard mask 120 of comparable sizes.

Figure 7:
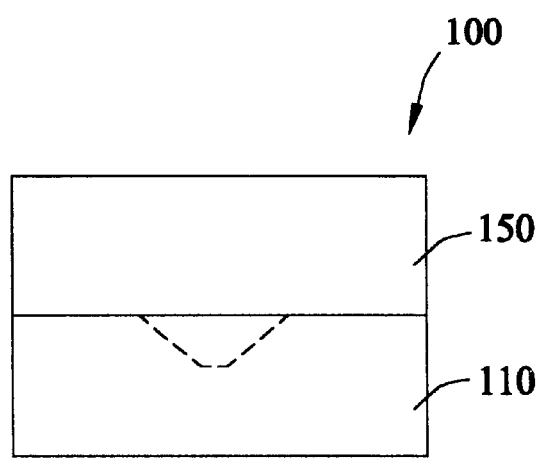
FIG. 7 is a schematic representation of an exemplary step in the formation of a stamp.

Once groove 140 is formed, patterned hard mask 120 is removed and a PDMS stamp material layer 150 is provided (FIG. 7). Groove 140 is silicon wafer 110 creates a wedge shaped extrusion in PDMS stamp material layer 150.

While the exemplary embodiments illustrated in the FIGURES and described above are presently preferred, it should be understood that these embodiments are offered by way of example only. Other embodiments may include, for example, stamps having a variety of different shaped extrusions or trench-forming structures. The invention is not limited to a particular embodiment, but extends to various modifications, combinations, and permutations that nevertheless fall within the scope and spirit of the appended claims.

What is claimed is:

1. A method of forming local interconnect in an integrated circuit using microcontact printing, the method comprising:

applying an material to a stamp, the stamp having a wedge-shaped extrusion, the wedge-shaped extrusion having a length corresponding to a length of an interconnect to be formed in a portion of an integrated circuit wafer;

stamping the stamp on the portion of the integrated circuit wafer to form an aperture in a layer of material on the integrated circuit wafer; and providing a conductive material in the aperture formed by the stamp, the conductive material in the aperture defining the interconnect.

2. The method of claim 1, wherein the step of applying an material to a stamp comprises covering a surface of the stamp which comes into contact with the integrated circuit wafer during the step of stamping the stamp.

3. The method of claim 1, wherein the material serves as a catalytic colloid.

4. The method of claim 1, further comprising transferring the material to the integrated circuit wafer.

5. The method of claim 4, wherein the transferred material provides a seeding layer for electroless copper (Cu) deposition.

6. The method of claim 5, wherein the conductive material provided in the providing a conductive material in the aperture step comprises copper (Cu).

7. The method of claim 1, wherein the step of providing a conductive material in the aperture formed by the stamp comprises electroless copper (Cu) deposition.

8. The method of claim 1, wherein the stamp is a poly(dimethylsiloxane) (PDMS) stamp.

9. The method of claim 1, wherein the interconnect has a width of between 20 and 50 nanometers (nm).

10. A method of fabricating an integrated circuit, the method comprising:

providing a dielectric layer over an integrated circuit wafer;

selectively forming a trench in the dielectric layer by stamping using an extrusion from a stamp; and filling the trench with a conductive material to form an interconnect.

11. The method of claim 10, wherein the step of selectively forming a trench in the dielectric layer using an extrusion from a stamp comprises stamping the extrusion of the stamp in a location of the dielectric layer where an interconect is to be formed.

12. The method of claim 11, wherein the location in the dielectric layer comprises over an active region of the integrated circuit wafer.

13. The method of claim 12, wherein the active region comprises a source region.

14. The method of claim 10, further comprising providing an material to the stamp, the material serving as a catalytic colloid.

15. The method of claim 14, further comprising transferring at least a portion of the material from the stamp to the integrated circuit wafer, the material serving as a seeding layer for electroless copper (Cu) deposition.

16. The method of claim 10, wherein the trench formed in the step of selectively forming a trench in the dielectric layer using an extrusion from a stamp has a width of between 20 and 50 nanometers (nm).

17. The method of claim 10, wherein the stamp is a poly(dimethylsiloxane) (PDMS) stamp.

18. The method of claim 10, wherein the conductive material comprises copper (Cu).

19. The method of claim 10, wherein the extrusion has a wedge shape.

20. The method of claim 19, wherein the extrusion is between about 250 and about 750 nm long.

* * * * *